US012144158B2

(12) United States Patent
Zhou et al.

(10) Patent No.: US 12,144,158 B2
(45) Date of Patent: *Nov. 12, 2024

(54) POWER ELECTRONICS ASSEMBLIES HAVING EMBEDDED POWER ELECTRONICS DEVICES

(71) Applicant: Toyota Motor Engineering & Manufacturing North America, Inc., Plano, TX (US)

(72) Inventors: Feng Zhou, Ann Arbor, MI (US); Tianzhu Fan, Houston, TX (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 233 days.

This patent is subject to a terminal disclaimer.

(21) Appl. No.: 17/967,425

(22) Filed: Oct. 17, 2022

(65) Prior Publication Data
US 2024/0130093 A1   Apr. 18, 2024

(51) Int. Cl.
*H05K 7/20* (2006.01)
*H01L 23/367* (2006.01)
(Continued)

(52) U.S. Cl.
CPC ............ *H05K 7/209* (2013.01); *H01L 23/367* (2013.01); *H05K 1/0204* (2013.01); *H05K 1/05* (2013.01);
(Continued)

(58) Field of Classification Search
CPC ........... H05K 7/20918; H05K 7/20509; H05K 7/209; H05K 7/20254; H05K 1/204; H05K 1/0204; H05K 1/05; H05K 3/0026; H05K 3/0061; H01L 23/3677; H01L 21/3672; H01L 23/3672; H01L 23/3736; H01L 23/3735
See application file for complete search history.

(56) References Cited

U.S. PATENT DOCUMENTS 11,665,813 B2 *  5/2023  Zhou .................. H05K 7/205
                                                            361/719
11,690,173 B2 *  6/2023  Tseng ................. H05K 1/185
                                                            361/761

(Continued)

FOREIGN PATENT DOCUMENTS

CN     113917403 A      1/2022
DE     102009030325 A1  2/2010
WO     2022066746 A1    3/2022

*Primary Examiner* — Mandeep S Buttar
*Assistant Examiner* — Matthew Sinclair Muir
(74) *Attorney, Agent, or Firm* — Dinsmore & Shohl LLP

(57) ABSTRACT

A power electronics assembly includes a circuit board assembly including a first electrically insulating layer, an electrically insulating substrate, a laminate panel provided between the first electrically insulating layer and the electrically insulating substrate, and one or more electrically conductive layers provided within the electrically insulating substrate. The laminate panel includes a power electronics device assembly including an S-cell and a power electronics device. The S-cell includes a graphite layer and a metal layer encasing the graphite layer. A recess is formed in an outer surface of the metal layer and the power electronics device is disposed within the recess of the outer surface of the S-cell.

20 Claims, 9 Drawing Sheets

(51) Int. Cl.
*H05K 1/02* (2006.01)
*H05K 1/05* (2006.01)
*H05K 3/00* (2006.01)

(52) U.S. Cl.
CPC ......... *H05K 3/0026* (2013.01); *H05K 3/0061* (2013.01); *H05K 7/20254* (2013.01)

(56) References Cited

U.S. PATENT DOCUMENTS

| | | | |
|---|---|---|---|
| 11,910,521 B2* | 2/2024 | Zhou | H05K 1/0272 |
| 2009/0185352 A1 | 7/2009 | Ellsworth et al. | |
| 2016/0209133 A1* | 7/2016 | Hu | H01L 21/4882 |
| 2018/0014435 A1 | 1/2018 | Occhionero | |
| 2021/0305121 A1 | 9/2021 | Malik et al. | |
| 2022/0053634 A1* | 2/2022 | Zhou | H01L 23/427 |
| 2023/0043071 A1* | 2/2023 | Wasserman | H01L 23/373 |

* cited by examiner

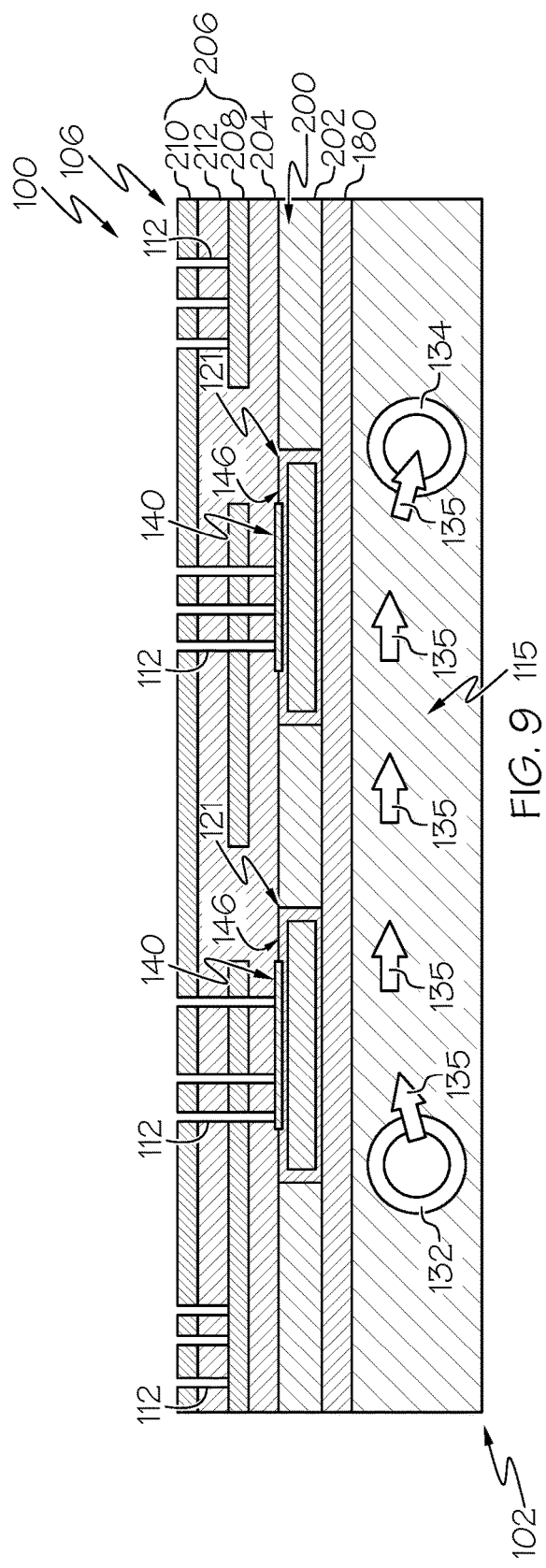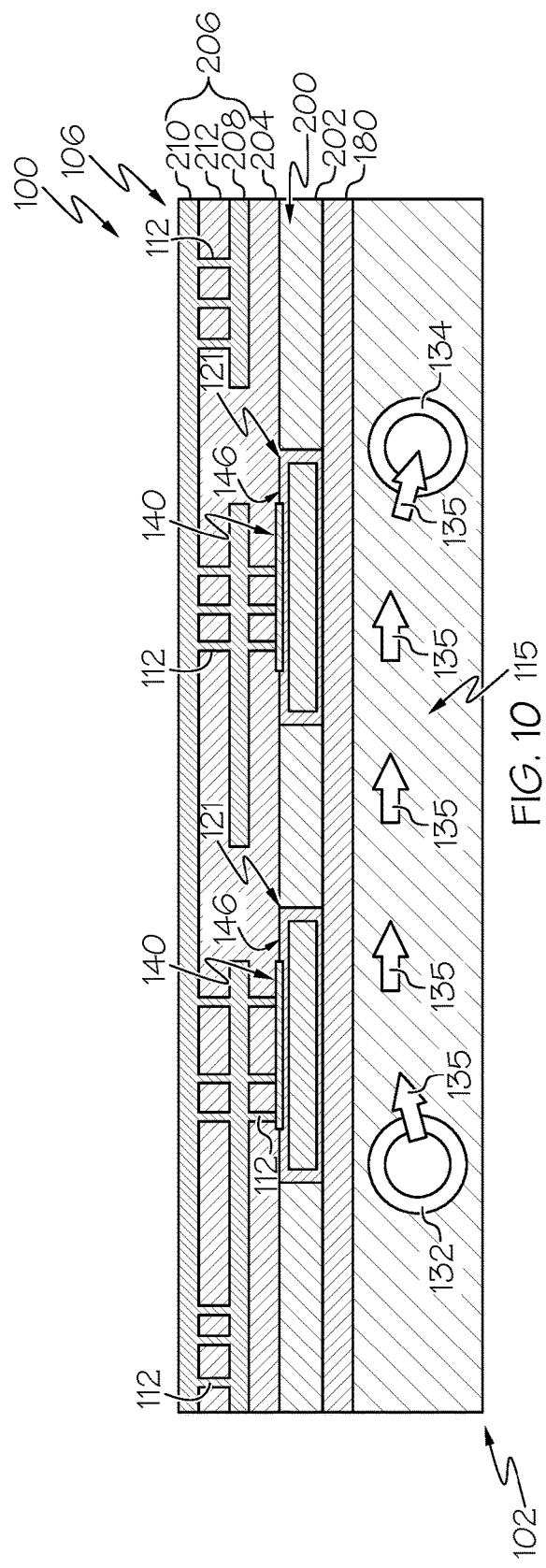

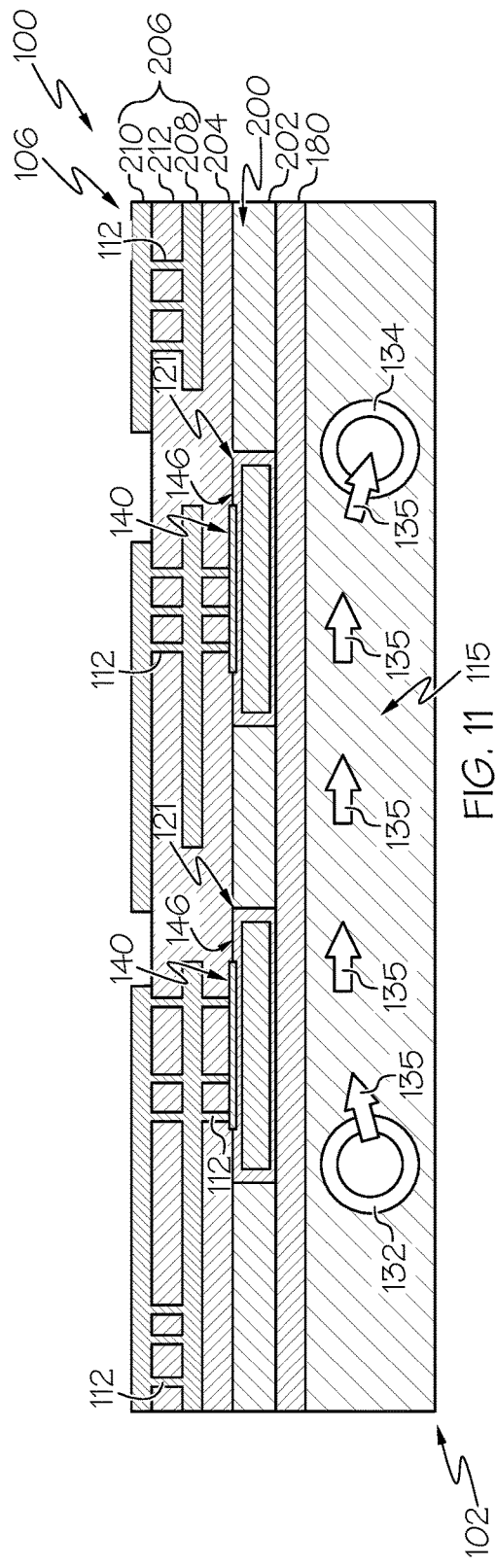
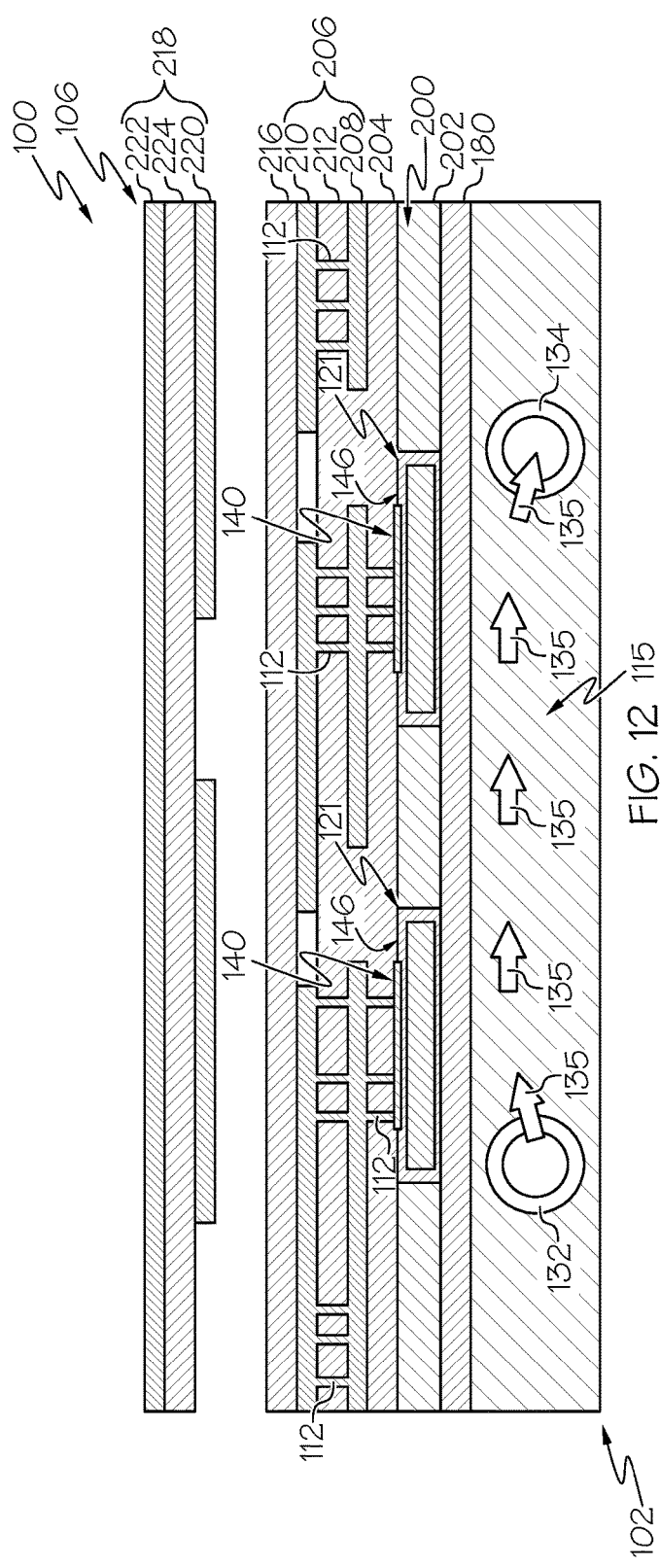

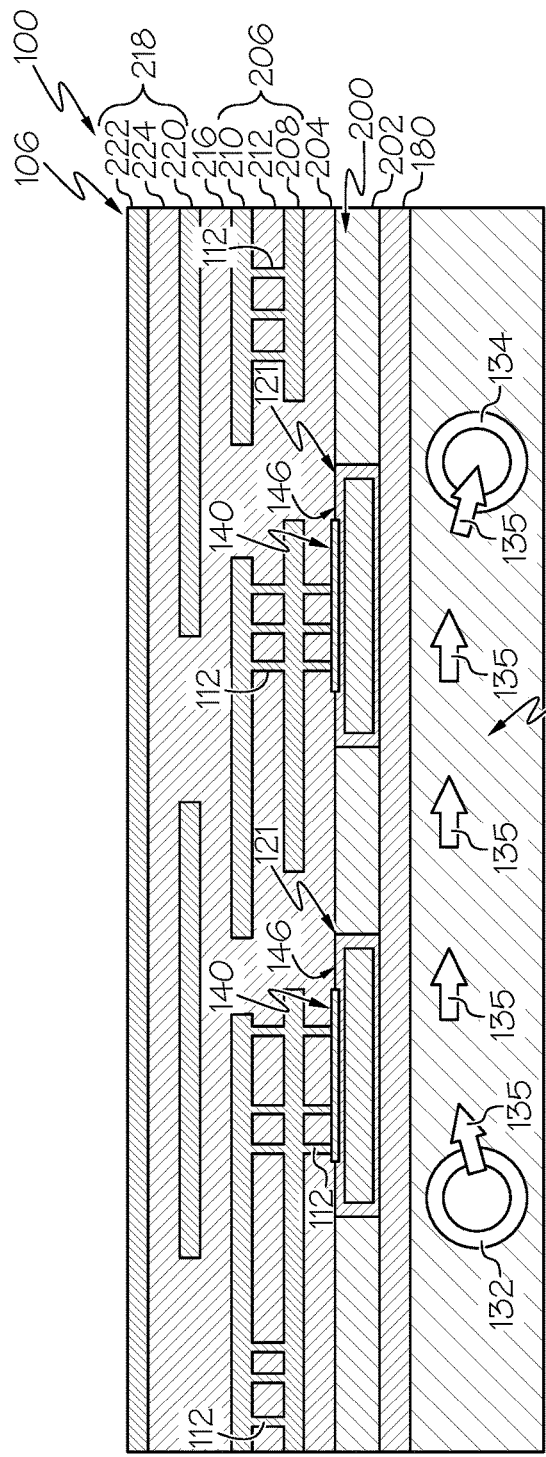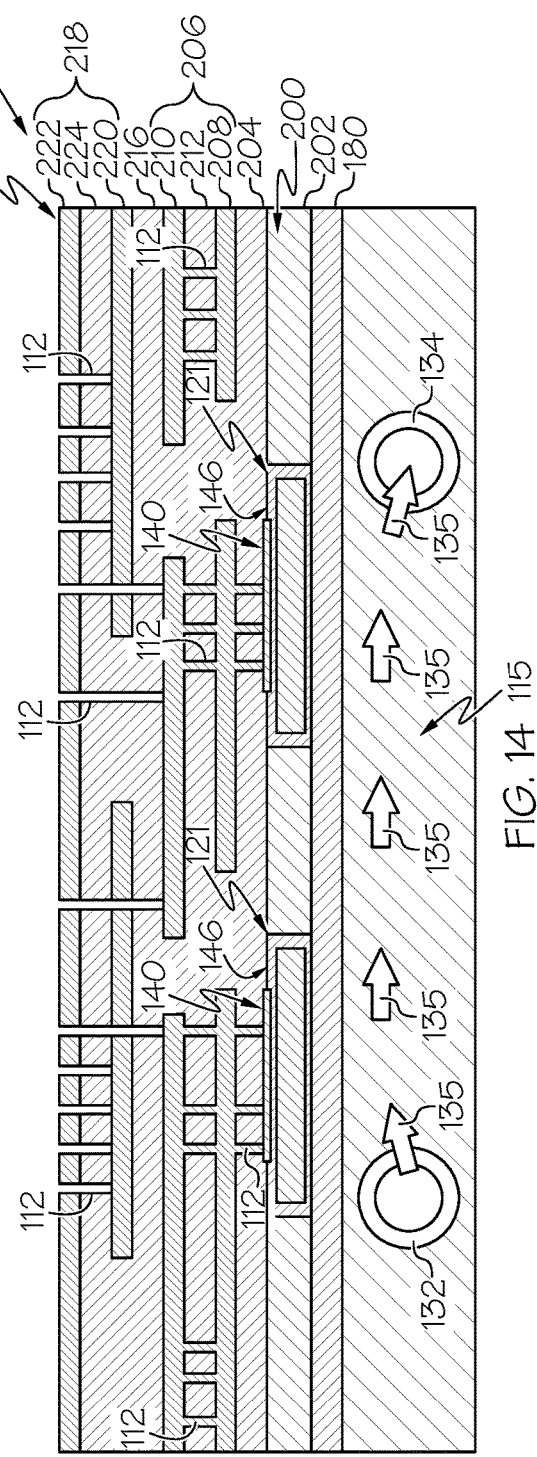

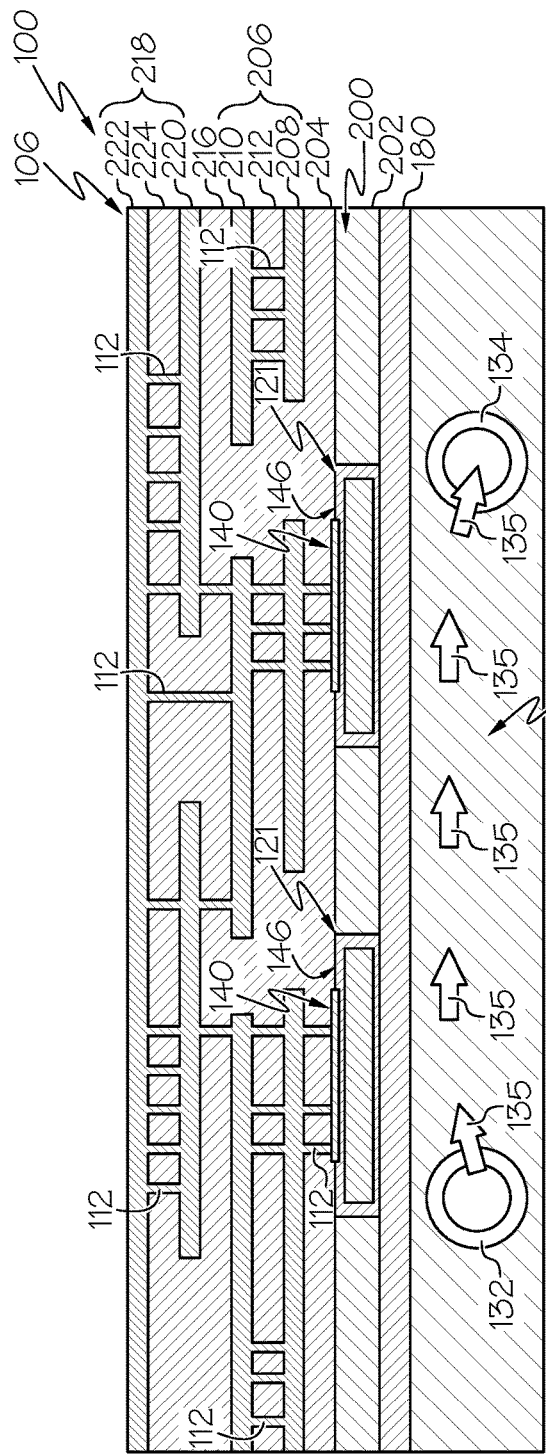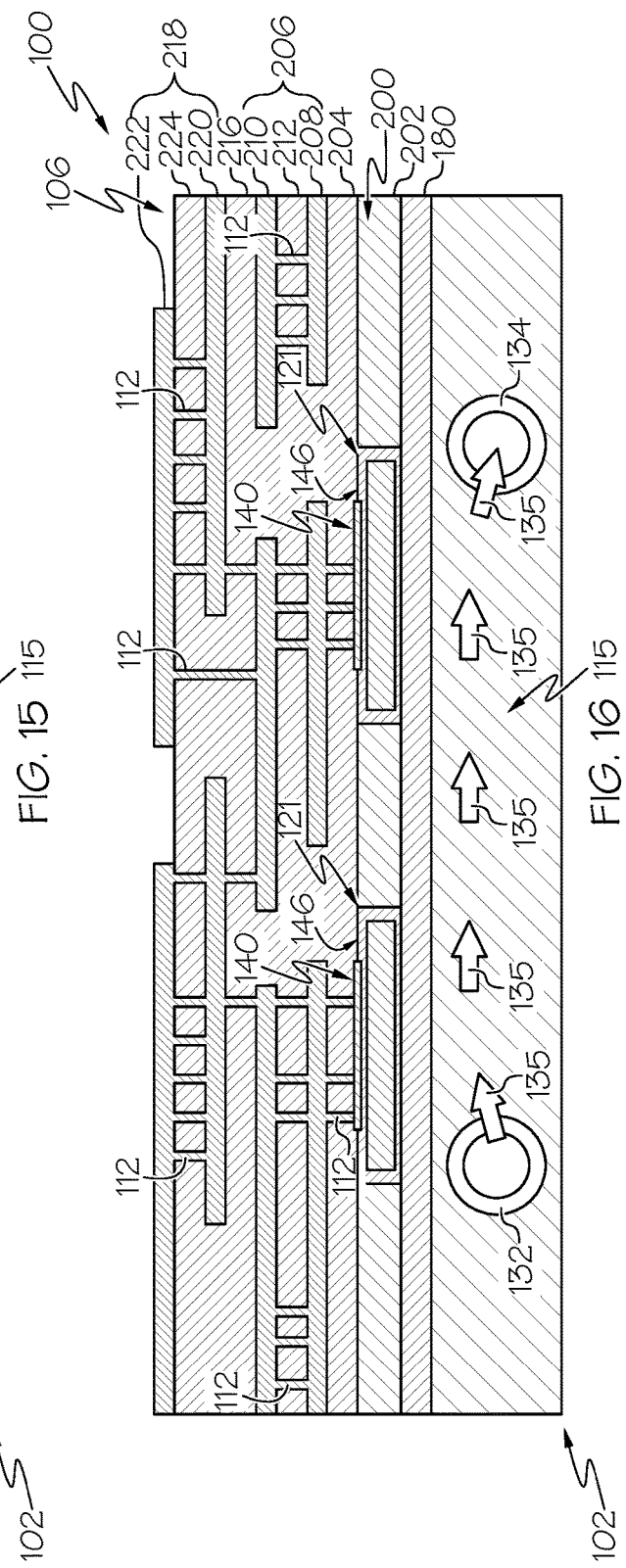

POWER ELECTRONICS ASSEMBLIES HAVING EMBEDDED POWER ELECTRONICS DEVICES

TECHNICAL FIELD

The present specification generally relates to power electronic assemblies and, more specifically, apparatus and methods for power electronic assemblies having low overall thermal resistance while achieving a compact package size.

BACKGROUND

Due to the increased use of electronics in vehicles, there is a need to make electronic systems more compact. One component of these electronic systems is a power electronic device used as a switch in an inverter. Power electronic devices have large cooling requirements due to the heat generated.

Additionally, there has been a trend for power electronic devices conventionally composed of silicon to now be composed of silicon-carbide. The use of silicon-carbide causes a larger heat flux due to it defining a smaller device footprint. For these reasons, and more, there is a need to improve the cooling of power electronic devices while maintaining a compact package size.

SUMMARY

In one embodiment, a power electronics assembly includes: a circuit board assembly including: a first electrically insulating layer; an electrically insulating substrate; a laminate panel provided between the first electrically insulating layer and the electrically insulating substrate, the laminate panel including: a power electronics device assembly including: an S-cell including: a graphite layer; and a metal layer encasing the graphite layer, a recess formed in an outer surface of the metal layer; and a power electronics device disposed within the recess of the outer surface of the S-cell; and one or more electrically conductive layers provided within the electrically insulating substrate.

In another embodiment, a power electronics assembly includes: a circuit board assembly including: a first electrically insulating layer; an electrically insulating substrate; a laminate panel provided between the first electrically insulating layer and the electrically insulating substrate, the laminate panel including: a plurality of power electronics device assemblies, each power electronics device assembly including: an S-cell including: a graphite layer; and a metal layer encasing the graphite layer, a recess formed in an outer surface of the metal layer; and a power electronics device disposed within the recess of the outer surface of the S-cell; and one or more electrically conductive layers provided within the electrically insulating substrate a plurality of thermal vias thermally coupling each of the power electronics devices to the one or more electrically conductive layers; and a cold plate, the metal layer of each S-cell bonded to the circuit board assembly is bonded to a first surface of the cold plate via the first electrically insulating layer.

In yet another embodiment, a method includes: providing a first electrically insulating layer on a first surface of a cold plate; providing a laminate panel on the first electrically insulating layer opposite the cold plate, the laminate panel including: a power electronics device assembly including: an S-cell including: a graphite layer; and a metal layer encasing the graphite layer, a recess formed in an outer surface of the metal layer; and a power electronics device disposed within the recess of the outer surface of the S-cell; laminating a first two layer circuit pair onto the laminate panel opposite the first electrically insulating layer; laser drilling vias through the first two layer circuit pair; and filling the vias with an electrically conductive material to thermally couple the first two layer circuit pair to the power electronics device.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 9 schematically depicts an assembled cross-section view of the power electronics assembly of FIG. 1 illustrating vias formed through the first two layer circuit pair of the circuit board assembly, according to one or more embodiments described and illustrated herein;

FIG. 10 schematically depicts an assembled cross-section view of the power electronics assembly of FIG. 1 illustrating the vias of FIG. 9 filled, according to one or more embodiments described and illustrated herein;

FIG. 11 schematically depicts an assembled cross-section view of the power electronics assembly of FIG. 1 illustrating etching of the first two layer circuit pair of the circuit board assembly, according to one or more embodiments described and illustrated herein;

FIG. 12 schematically depicts an exploded cross-section view of the power electronics assembly of FIG. 1 illustrating a second two layer circuit pair of the circuit board assembly, according to one or more embodiments described and illustrated herein;

FIG. 13 schematically depicts an assembled cross-section view of the power electronics assembly of FIG. 1 illustrating the second two layer circuit pair of the circuit board assembly, according to one or more embodiments described and illustrated herein;

FIG. 14 schematically depicts an assembled cross-section view of the power electronics assembly of FIG. 1 illustrating vias formed through the second two layer circuit pair of the circuit board assembly, according to one or more embodiments described and illustrated herein;

FIG. 15 schematically depicts an assembled cross-section view of the power electronics assembly of FIG. 1 illustrating the vias of FIG. 14 filled, according to one or more embodiments described and illustrated herein;

FIG. 16 schematically depicts an assembled cross-section view of the power electronics assembly of FIG. 1 illustrating etching of the second two layer circuit pair of the circuit board assembly, according to one or more embodiments described and illustrated herein.

DETAILED DESCRIPTION

Figure 1:
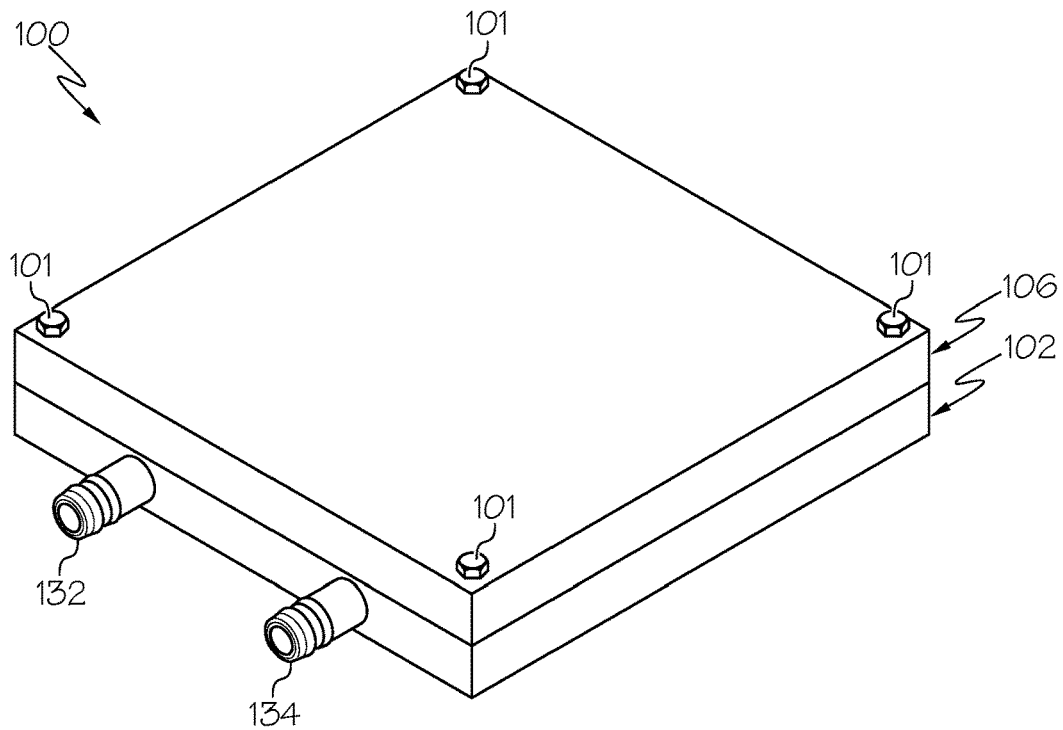
FIG. 1 schematically depicts an assembled perspective view of a power electronics assembly including a cold plate and a circuit board assembly, according to one or more embodiments described and illustrated herein.

Embodiments described herein are generally directed to power electronics assemblies having a circuit board assembly coupled to a cold plate, the circuit board assembly including a power electronics device assembly that includes an S-cell. A power electronics device may be embedded within the S-cell.

The power electronics device assemblies of the present disclosure comprise a power electronics device affixed to a mounting substrate referred to herein as an S-cell. As described in more detail below, the S-cell includes a graphite layer that provides enhanced heat spreading capabilities. Further, embodiments of the present disclosure include one or more electrical isolation layers that electrically isolate the power electronics device(s) from a cold plate. For example, an electrically insulating layer of the S-cell enables the removal of an electrical insulation layer between the printed circuit board and the cold plate because the electrical isolation is provided by the S-cell itself.

As described in more detail below, the S-cells of the present disclosure provide enhanced thermal properties due to graphite layers that promote heat flux flow toward a cold plate. The S-cells described herein include stacked metal, graphite, and one or more electrically insulating layers in a compact package. The bonding materials described herein for bonding the S-cells are particularly adapted for increased thermal conductivity relative to other bonding technologies, while also maintaining an ability of electrically insulate the S-cells. The devices, systems, and apparatuses described herein improves the heat flux from the S-cell to the cold plate, thereby increasing heat spreading and cooling performance for the circuit board assembly.

The cold plates, power electronics device assemblies, circuit board assemblies, power electronics assemblies, and the like described herein may be used in electrified vehicles, such as and without being limited to, an electric vehicle, a hybrid electric vehicle, any electric motor, generators, industrial tools, household appliances, and the like. The various assemblies described herein may be electrically coupled to an electric motor and/or a battery, and may be configured as an inverter circuit operable to convert direct current (DC) electrical power to alternating current (AC) electrical power.

As used herein, a "power electronics device" means any electrical component used to convert DC electrical power to AC electrical power and vice-versa. Embodiments may also be employed in AC-AC converter and DC-DC converter applications. Non-limiting examples of power electronics devices include power metal-oxide-semiconductor field effect transistors (MOSFET), insulated-gate bipolar transistors (IGBT), thyristors, and power transistors.

As used herein, the phrase "fully embedded" means that each surface of a component is surrounded by a substrate. For example, when a power electronics device assembly is fully embedded by a circuit board substrate, it means that the material of the circuit board substrate covers each surface of the circuit board substrate. A component is "partially embedded" when one or more surfaces of the component are exposed.

As used herein, an "S-cell" is a mounting substrate operable to be affixed to a power electronics device and includes one or more of a metal layer, a graphite layer, and an electrically insulating layer.

Various embodiments of power electronics assemblies, power electronics device assemblies, and cold plates are described in detail below. Whenever possible, the same reference numerals will be used throughout the drawings to refer to the same or like parts.

Figure 2:
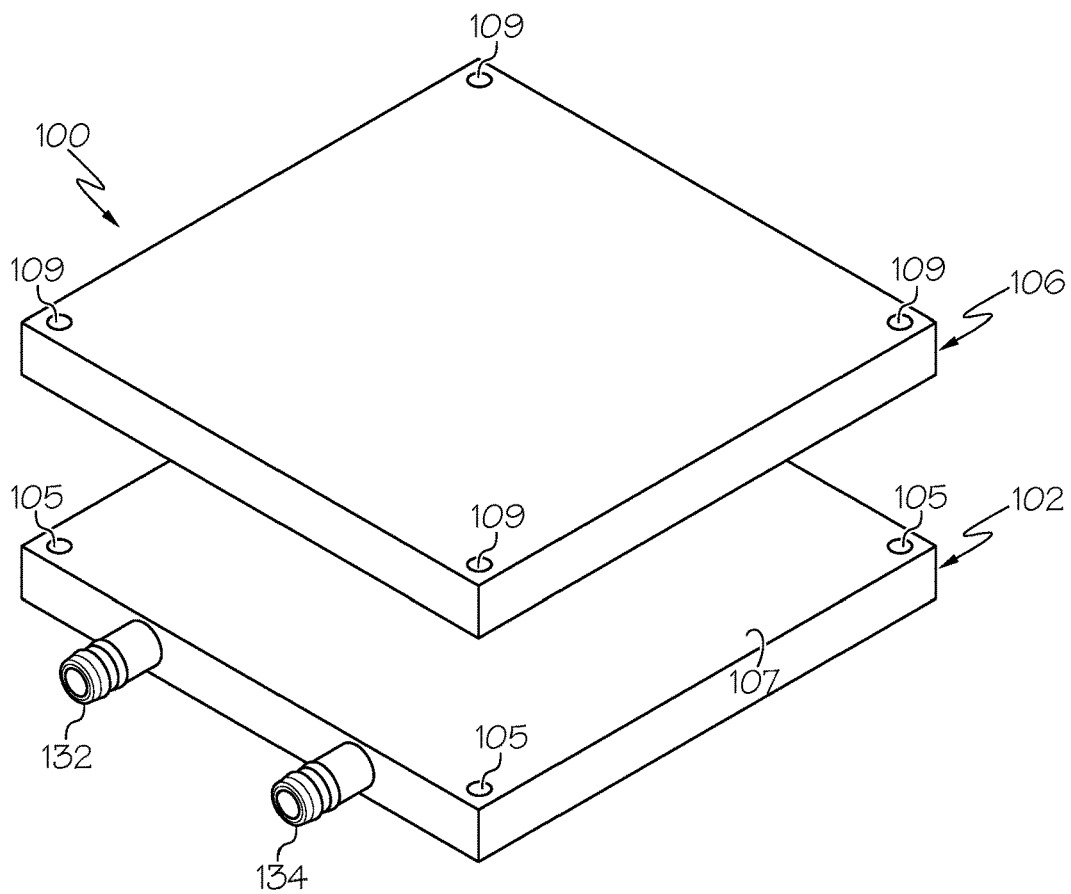
FIG. 2 schematically depicts an exploded perspective view of the power electronics assembly of FIG. 1, according to one or more embodiments described and illustrated herein.

Referring now to FIGS. 1 and 2, an example power electronics assembly 100 is generally illustrated in an assembled view and an exploded view, respectively. The power electronics assembly 100 illustrated in FIGS. 1 and 2 includes a cold plate 102 and a circuit board assembly 106. The cold plate 102 may be any device capable of removing heat flux from the power electronics devices 140 (see FIG. 4) coupled to a substrate material of the circuit board assembly 106. Non-limiting examples for the cold plate 102 include heat sinks, single-phase liquid cooling, two-phase liquid cooling, and vapor chambers. FIGS. 1 and 2 illustrate the cold plate 102 has being configured as a single-phase liquid cooling device. The cold plate 102 includes a fluid inlet 132 and a fluid outlet 134 fluidly coupled to a fluid chamber 115 (FIG. 7) within the cold plate 102. While FIGS. 1 and 2 depict the fluid inlet 132 and the fluid outlet 134 as being on the same side of the cold plate 102, the present disclosure is not limited to such an embodiment. That is, in other embodiments, the fluid inlet 132 and the fluid outlet 134 may be positioned on other surfaces.

Referring again to FIGS. 1 and 2, the circuit board assembly 106 is coupled (e.g., affixed) to a first surface 107 of the cold plate 102. FIGS. 1 and 2 illustrate the circuit board assembly 106 as being affixed to the first surface 107 of the cold plate 102 by way of fasteners 101 (e.g., bolts and nuts) extending through through-holes 105 of the cold plate 102 and through-holes 109 of the circuit board assembly 106. It should be appreciated that, in other embodiments, the through-holes 105, 109 and fasteners 101 may be omitted, as described below.

In embodiments, the circuit board assembly 106 may be 3D printed layers. It should be appreciated that in such embodiments, the 3D printed layers of the circuit board assembly 106 reduce overall thermal resistance. In embodiments, the circuit board assembly 106 may be laminated to the cold plate 102. However, other additive manufacturing processes for affixing the circuit board assembly 106 to the cold plate 102 are also contemplated and included within the scope of the present disclosure. In addition, as described in more detail herein, via connections or vias may be made between the various components of the circuit board assembly 106 and the power electronics devices 140 (FIG. 4) using laser drilling. That is, the vias are drilled through the circuit board assembly 106 to the top surface of each conductive layer and the power electronics devices 140. As described in more detail herein, the vias are then filled with copper via an electroplating method to establish electrical connections between components. Although the circuit board assembly 106 is generally depicted in FIGS. 1 and 2, the individual layers and various steps of assembly are depicted in FIGS. 6-17.

Figure 3:
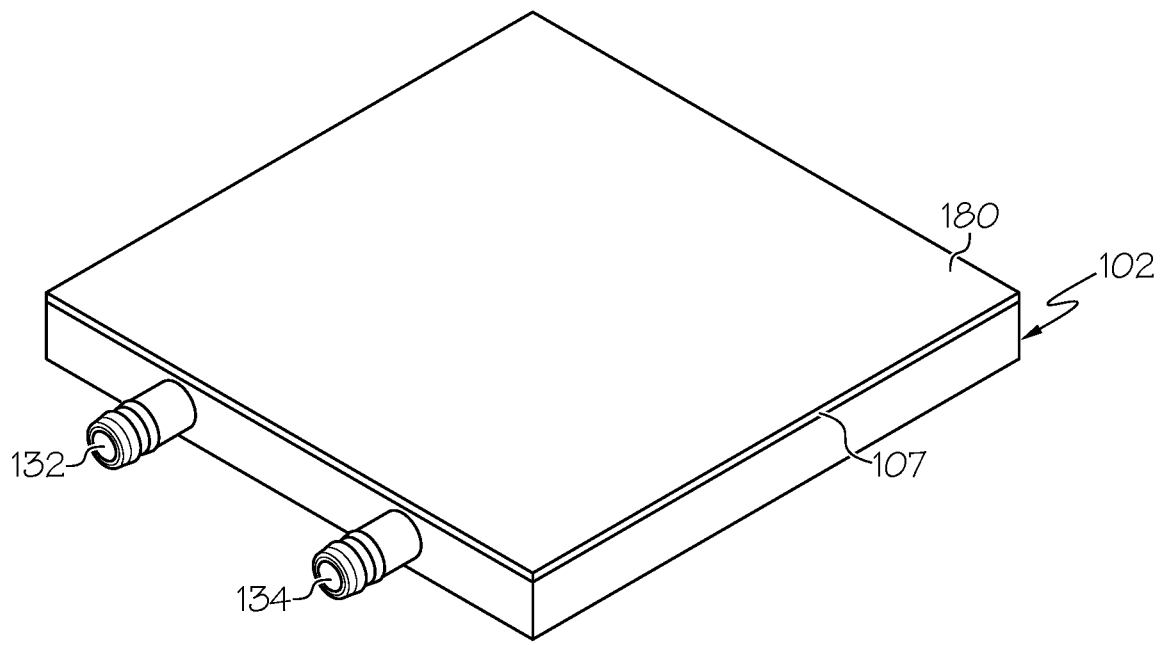
FIG. 3 schematically depicts a partial perspective view of the cold plate of the power electronics assembly of FIG. 1, according to one or more embodiments described and illustrated herein.

Referring now to FIGS. 3-17, the individual steps of manufacturing the power electronics assembly 100 is depicted. As shown in FIG. 3, a first electrically insulating layer 180 is shown deposited onto the first surface 107 of the cold plate 102 to lower the thermal resistance between the circuit board assembly 106 and the cold plate 102 (FIG. 1). The first electrically insulating layer 180 may generally be any layer that provides electrical insulation, such as ceramic or the like. In embodiments, the first electrically insulating layer 180 includes an insulation metal substrate (IMS) dielectric film. The IMS dielectric film may be a solid film layer. In other embodiments, the first electrically insulating layer 180 may be a thermal grease layer. It is noted that the first electrically insulating layer 180 may not have dedicated through-holes.

Figure 4:
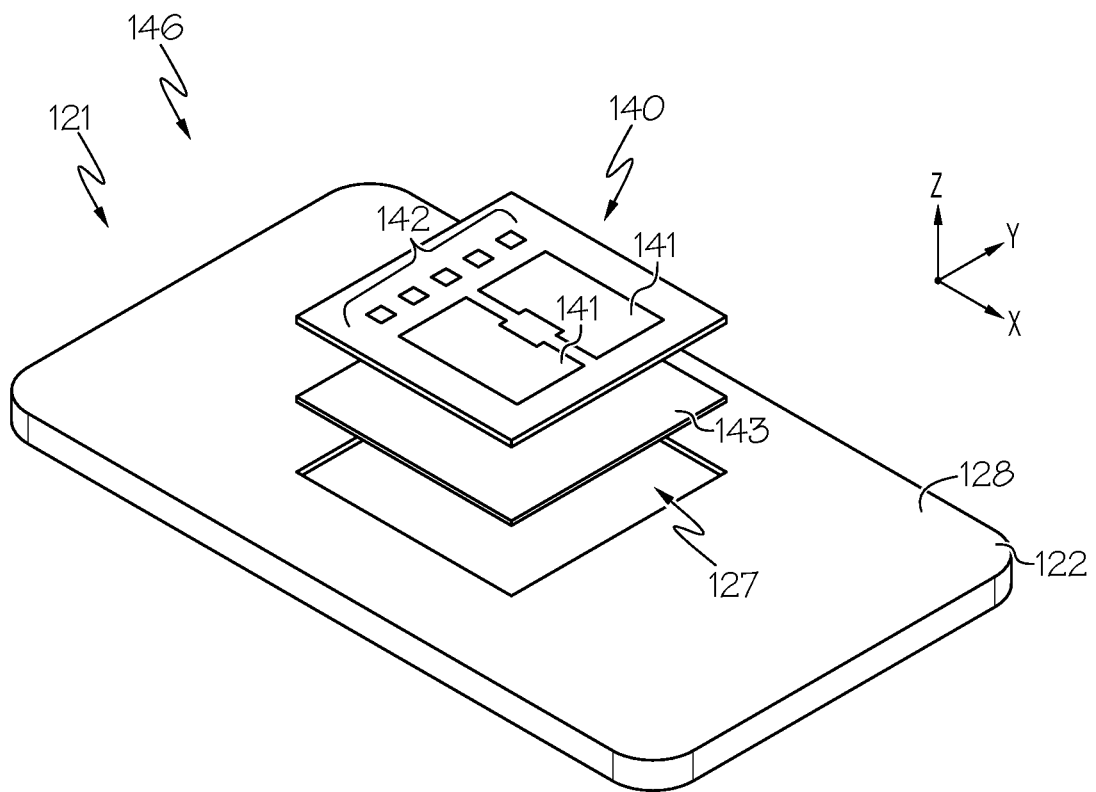
FIG. 4 schematically depicts an exploded perspective view of a power electronics device assembly including an S-cell and a power electronics device, according to one or more embodiments described and illustrated herein.
Figure 5:
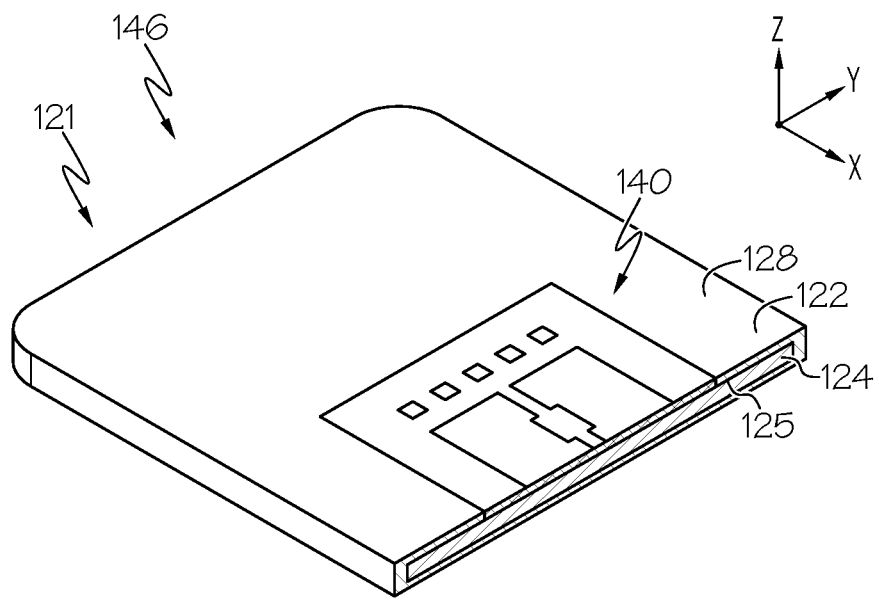
FIG. 5 schematically depicts a cross-section view of the power electronics device assembly of FIG. 4, according to one or more embodiments described and illustrated herein.

Referring now to FIGS. 4 and 5 an exploded top perspective view and an assembled cross-sectional view, respectively, of an example S-cell 121 is shown. The S-cell 121 includes a plurality of stacked layers. Particularly, the S-cell 121 illustrated in FIGS. 4 and 5 includes a metal layer 122 and a graphite layer 124 embedded within the metal layer 122. The metal layer 122 includes an inner surface 125 and an outer surface 128 opposite the inner surface 125. In embodiments, the metal layer 122 includes a first metal layer and a second metal layer with the graphite layer 124 positioned between the first metal layer and the second metal layer. The metal layer 122 includes a recess 127 disposed in the outer surface 128 of the metal layer 122. The recess 127 is dimensioned to receive a power electronics device 140. As described in more detail below, the metal layer 122 provides an electrically conductive surface to which electrodes on a bottom surface of the power electronics device 140 are connected (e.g., via a direct connection and/or via electrically connective vias). It should be appreciated that the various layers of the S-cell 121 depicted in FIGS. 4 and 5 is merely illustrative. That is, for example, the S-cell 121 may include a plurality of graphite layers and/or other layers disposed between metal layers in some embodiments.

It is noted that the S-cell 121 in the embodiment of FIGS. 4 and 5 includes the graphite layer 124 embedded within the metal layer 122 to provide an S-cell 121 that is symmetrical along a z-axis of the coordinate axes depicted in FIGS. 4 and 5. The symmetrical nature of the S-cell 121 balances forces on the S-cell 121 during the high-temperature bonding process. Because the metal layer 122 and the graphite layer 124 have different coefficients of thermal expansion, it may be desirable to have a symmetrical substrate stack to balance the thermally induced stresses during the bonding process.

The metal layer 122 may be made of any suitable metal or alloy. Copper and aluminum may be used as the metal layer as non-limiting examples. The metal layer 122 of the S-cell 121 has a recess 127 formed in the outer surface 128 thereof. The recess 127 may be formed by chemical etching, for example. The recess 127 has a size and shape to accept the power electronics device 140. The outer surface 128 may generally be a second major face or surface of the metal layer 122 that is opposite the inner surface 125 (which is configured as a first major face or surface of the metal layer 122). That is, the metal layer 122 may be a planar layer whereby the inner surface 125 faces the graphite layer 124 and the opposite outer surface 128 faces the power electronics device 140 and the circuit board assembly 106 (FIG. 7).

Figure 7:
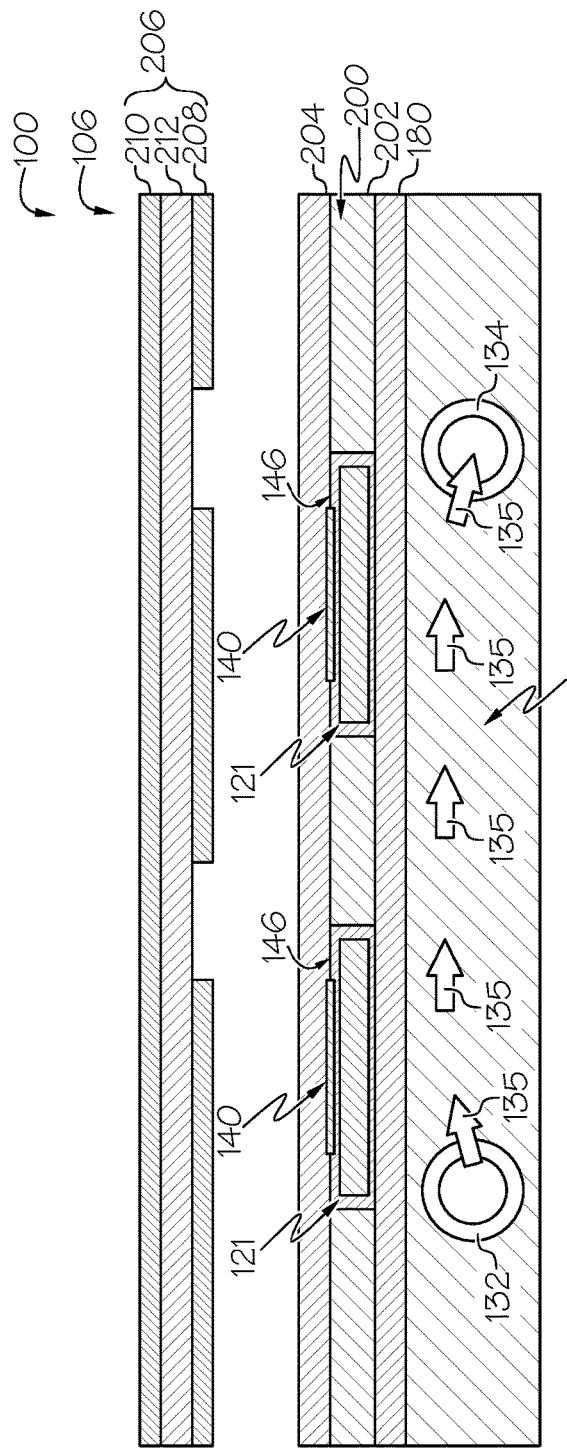
FIG. 7 schematically depicts an exploded cross-section view of the power electronics assembly of FIG. 1 illustrating a first two layer circuit pair of the circuit board assembly, according to one or more embodiments described and illustrated herein.

The graphite layer 124 depicted in the embodiment of FIG. 5 is provided to encourage heat spreading both across the S-cell 121 as well as toward the cold plate 102 (see, e.g., FIG. 7). The crystalline structure of graphite provides the graphite with high thermal conductivity, making it useful to conduct heat flux toward the cold plate 102. However, graphite does not have an isothermal profile. Rather, graphite has an anisothermal profile with high conductivity along two axes and low thermal conductivity in a third axis. To account for the anisothermal profile of graphite, the S-cell 121 is designed to be rectangular in shape such that its length dimension is greater than its width dimension. Referring to FIG. 5, the graphite layer 124 has high thermal conductivity along the x-axis and the z-axis of the coordinate axes depicted in FIG. 5. Thus, the S-cell 121 is designed such that its dimension along the x-axis is larger than its dimension along the y-axis. Heat flux will travel along the x-axis and z-axis. As described in more detail below, heat flux is moved by the S-cell 121 along the x-axis toward the cold plate 102. Heat flux will also travel along the z-axis toward the cold plate 102.

Referring again to FIG. 4, an exploded view of a power electronics device assembly 146 is depicted including the S-cell 121 and the power electronics device 140. FIG. 4 depicts the power electronics device 140 and a bonding layer 143 with respect to the recess 127 of the S-cell 121. The bonding layer 143 may be a solder layer, for example. As another example, the bonding layer 143 may be a transient liquid phase bonding layer 143. The power electronics device 140 includes a plurality of large electrodes 141 and a plurality of small electrodes 142 on its top surface. The large electrodes 141 may be power electrodes, while the small electrodes 142 may be signal electrodes. It is noted that, although not visible in FIG. 4, the power electronics device 140 further includes one or more electrodes on its bottom surface. The one or more electrodes on the bottom surface of the power electronics device 140 are electrically connected to the metal layer 122 by placement of the power electronics device 140 into the recess 127. Thus, electrical connection to the bottom electrodes of the power electronics device 140 may be made by way of the metal layer 122.

As stated above, the S-cell 121 is a substrate to which the power electronics device 140 is bonded. The S-cell 121 provides an electrically conductive surface area to make connections to electrodes on the bottom surface of the power electronics device 140. The S-cell 121 further provides heat spreading functionality as well as electrical isolation.

Figure 6:
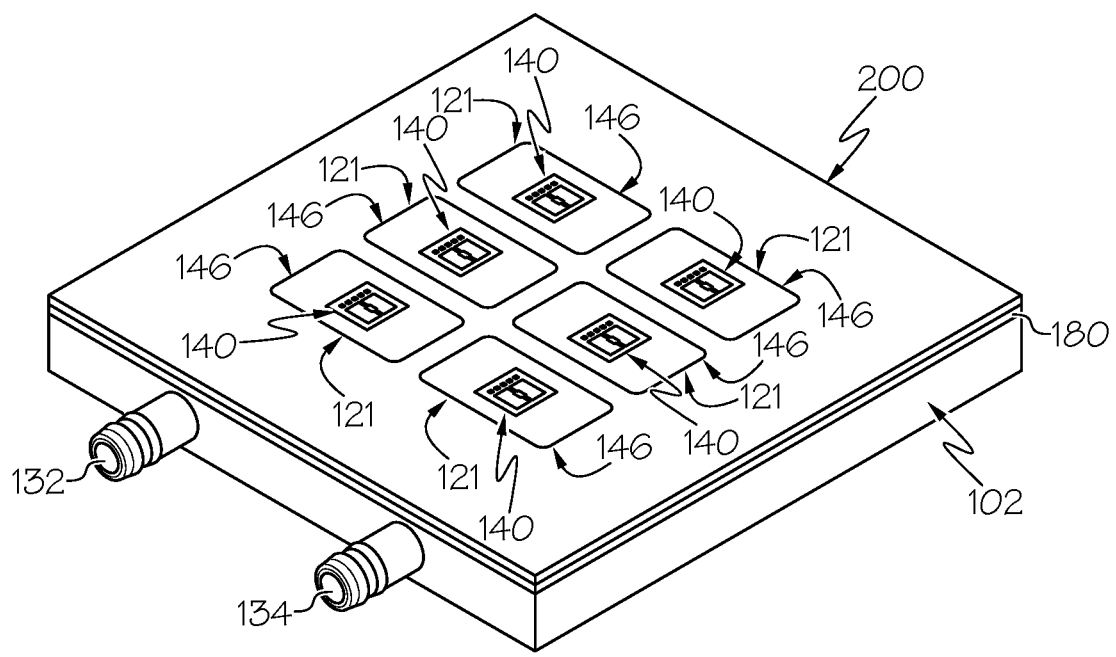
FIG. 6 schematically depicts a partial perspective view of the power electronics assembly of FIG. 1 including the cold plate and a laminate layer including a plurality of power electronics device assemblies, according to one or more embodiments described and illustrated herein.

Referring now to FIG. 6, a laminate panel 200 including one or more power electronics device assemblies 146 surrounded by a laminate material 202 are provided on the first electrically insulating layer 180 opposite the cold plate 102. In embodiments, the laminate material 202 includes FR-4, however, alternative materials are within the scope of the present disclosure. As shown, a total of six power electronics device assemblies 146 are provided and bonded to the cold plate 102 via the first electrically insulating layer 180 and the laminate material 202 in two rows of three. However, it should be understood that any number of power electronics device assemblies 146 may be utilized depending on the application.

Referring now to FIG. 7, a cross-sectional view of the power electronics assembly 100 is illustrated. Cooling fluid (depicted as moving arrows 135) from a reservoir (not shown) flows into the fluid chamber 115 through the fluid inlet 132 and out of the fluid chamber 115 through the fluid outlet 134 as warmed cooling fluid, where it is returned to the reservoir, such as after flowing through a heat exchanger (not shown) to remove heat from the cooling fluid 135. Although not shown, an array of fins may be provided in the fluid chamber 115 to provide additional surface area for heat transfer to the cooling fluid 135.

As shown, the laminate panel 200 is provided between the first electrically insulating layer 180 and a second electrically insulating layer 204. It should be appreciated that the second electrically insulating layer 204 may include the same material as the first electrically insulating layer 180.

Referring still to FIG. 7, a first two layer circuit pair 206 is shown positioned above the second electrically insulating layer 204 forming the circuit board assembly 106. The first two layer circuit pair 206 includes a first electrically conductive layer 208 and a second electrically conductive layer 210 laminated by a third electrically insulating layer 212 therebetween. In embodiments, the first electrically conductive layer 208 and the second electrically conductive layer 210 are copper layers. The first electrically conductive layer 208 is etched to the specified pattern to guide current while the second electrically conductive layer 210 remains unetched.

Figure 8:
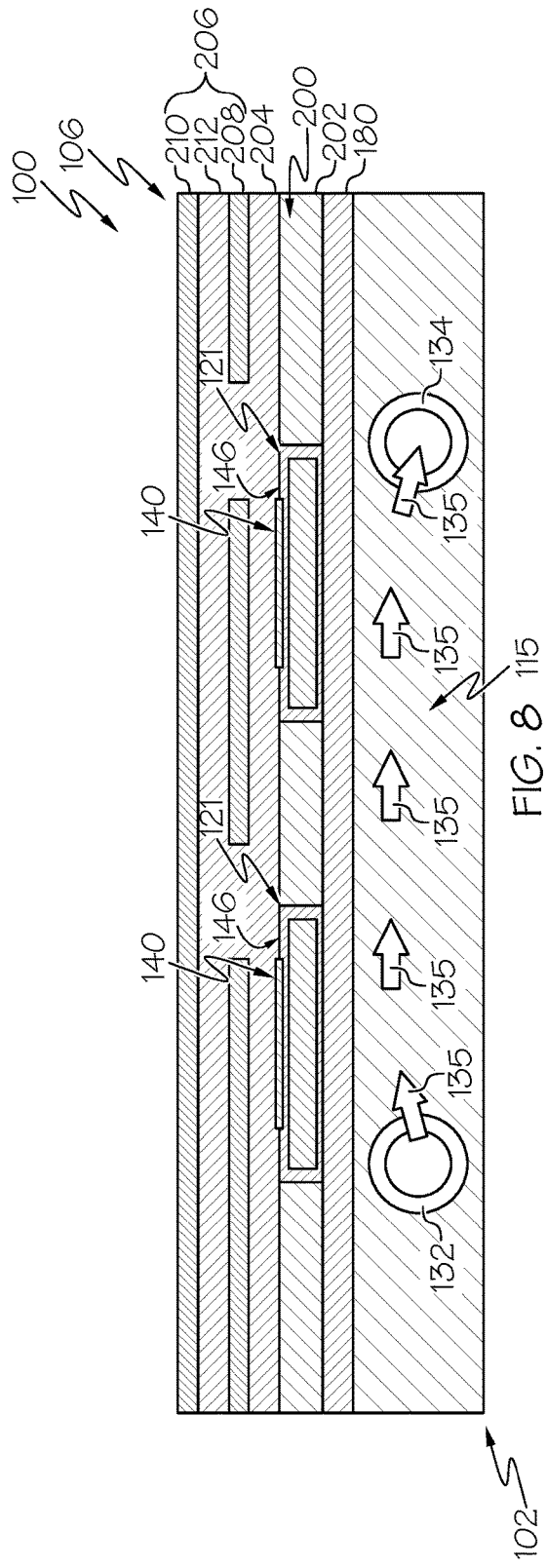
FIG. 8 schematically depicts an assembled cross-section view of the power electronics assembly of FIG. 1 illustrating the first two layer circuit pair of the circuit board assembly, according to one or more embodiments described and illustrated herein.

Referring now to FIG. 8, the first two layer circuit pair 206 is positioned onto the second electrically insulating layer 204. The first two layer circuit pair 206 is laminated to the second electrically insulating layer 204 in a high-temperature, high pressure chamber. During this lamination step, material from the second electrically insulating layer 204 and the third electrically insulating layer 212 fills gaps defined by the etching of the first electrically conductive layer 208.

Referring now to FIG. 9, vias 112 are formed to extend between any combination of the power electronics devices 140 of the power electronics device assemblies 146, the first electrically conductive layer 208, and the second electrically conductive layer 210. For example, vias 112 are shown extending between the power electronics device 140 of each power electronics device assembly 146 and the second electrically conductive layer 210 and through the first electrically conductive layer 208. Additionally, vias 112 (both electrically conducting vias and thermal vias) are shown extending between the first electrically conductive layer 208 and the second electrically conductive layer 210 without intersecting the power electronics devices 140. The vias 112 may be formed in any suitable manner such as, for example, laser drilling. It should be appreciated that the scope of the present disclosure is not limited to the particular configuration of vias 112 depicted in FIG. 9 and other configurations are contemplated based on the specific needs of the circuit board assembly 106.

The vias 112 may provide drive signals to the power electronics devices 140, as well as provide a current path for switching current. It is noted that, in some embodiments, some of the vias 112 may be configured as thermal vias that do not conduct drive signals or switching current. In addition, the S-cell arrangement allows for flux movement from the power electronics device 140 to the cold plate 102 via the S-cell 121, as described herein. In this way, heat flux is optimally directed away from the power electronics devices 140 and toward the cold plate 102 via the S-cell 121.

Referring now to FIG. 10, the vias 112 are filled with copper by electroplating to form electrical connections between each power electronics device assembly 146, the first electrically conductive layer 208, and the second electrically conductive layer 210. However, it should be appreciated that the vias 112 may be filled in any other suitable manner other than electroplating.

Referring now to FIG. 11, after the first two layer circuit pair 206 is laminated to the laminate panel 200 via the second electrically insulating layer 204, the second electrically conductive layer 210 may be etched to the desired configuration based on the specifications of the circuit board assembly 106. It should be appreciated that the circuit board assembly 106 may include any number of electrically conductive layers. For example, the circuit board assembly 106 may include only the first electrically conductive layer 208 and the second electrically conductive layer 210. In such an embodiment, one or more surface mounted electronics (such as surface mounted electronics 214 depicted in FIG. 17) such as, for example, transistors, resistors, capacitors, and the like, may be mounted to the second electrically conductive layer 210. However, in other embodiments, the circuit board assembly 106 may include a plurality of two layer circuit pairs with the surface mounted electronics mounted to the upper most electrically conductive layer. In doing so, the steps described herein with respect to FIGS. 7-11 may be repeated with each additional two layer circuit pair to be laminated to a previous two layer circuit pair.

For example, referring now to FIG. 12, a fourth electrically insulating layer 216 is provided on the second electrically conductive layer of the first two layer circuit pair 206 and a second two layer circuit pair 218 is shown positioned above the first two layer circuit pair 206. The second two layer circuit pair 218 includes a third electrically conductive layer 220 and a fourth electrically conductive layer 222 laminated by a fifth electrically insulating layer 224 therebetween. In embodiments, the third electrically conductive layer 220 and the fourth electrically conductive layer 222 are copper layers. The third electrically conductive layer 220 is etched to the specified pattern to guide current while the fourth electrically conductive layer 222 remains unetched.

Referring now to FIG. 13, the second two layer circuit pair 218 is positioned onto the first two layer circuit pair 206. The second two layer circuit pair 218 is laminated to the first two layer circuit pair 206 in a high-temperature, high pressure chamber. During this lamination step, material from the second electrically insulating layer 204 and the third electrically insulating layer 212 fills gaps defined by the etching of the second electrically conductive layer 210. Additionally, material from the fourth electrically insulating layer 216 and the fifth electrically insulating layer 224 fills gaps defined by the etching of the third electrically conductive layer 220. It should be appreciated that, in embodiments, the electrically insulating layers 204, 212, 216, 224 form a one-piece, monolithic electrically insulating substrate such that the laminate panel 200, and specifically the power electronics device assemblies 146, are provided within the electrically insulating substrate.

Referring now to FIG. 14, additional vias 112 are formed to extend between any combination of the first electrically conductive layer 208, the second electrically conductive layer 210, the third electrically conductive layer 220, and the fourth electrically conductive layer 222. For example, vias 112 are shown extending between the second electrically conductive layer 210 and the fourth electrically conductive layer 222 through the third electrically conductive layer 220. Additionally, vias 112 are shown extending between the third electrically conductive layer 220 and the fourth electrically conductive layer 222 without intersecting the power electronics devices 140, the first electrically conductive layer 208, or the second electrically conductive layer 210. As described herein, it should be appreciated that the scope of the present disclosure is not limited to the particular configuration of the vias 112 depicted in FIG. 14 and other configurations are contemplated based on the specific needs of the circuit board assembly 106.

Referring now to FIG. 15, as described herein, the vias 112 are filled with copper by electroplating to form electrical connections between each power electronics device assembly 146, the first electrically conductive layer 208, the second electrically conductive layer 210, the third electrically conductive layer 220, and the fourth electrically conductive layer 222, either directly or indirectly.

Lastly, as shown in FIG. 16, after the second two layer circuit pair 218 is laminated to the first two layer circuit pair 206 via the fourth electrically insulating layer 216, the fourth electrically conductive layer 222 may be etched to the desired configuration based on the specifications of the circuit board assembly 106.

Figure 17:
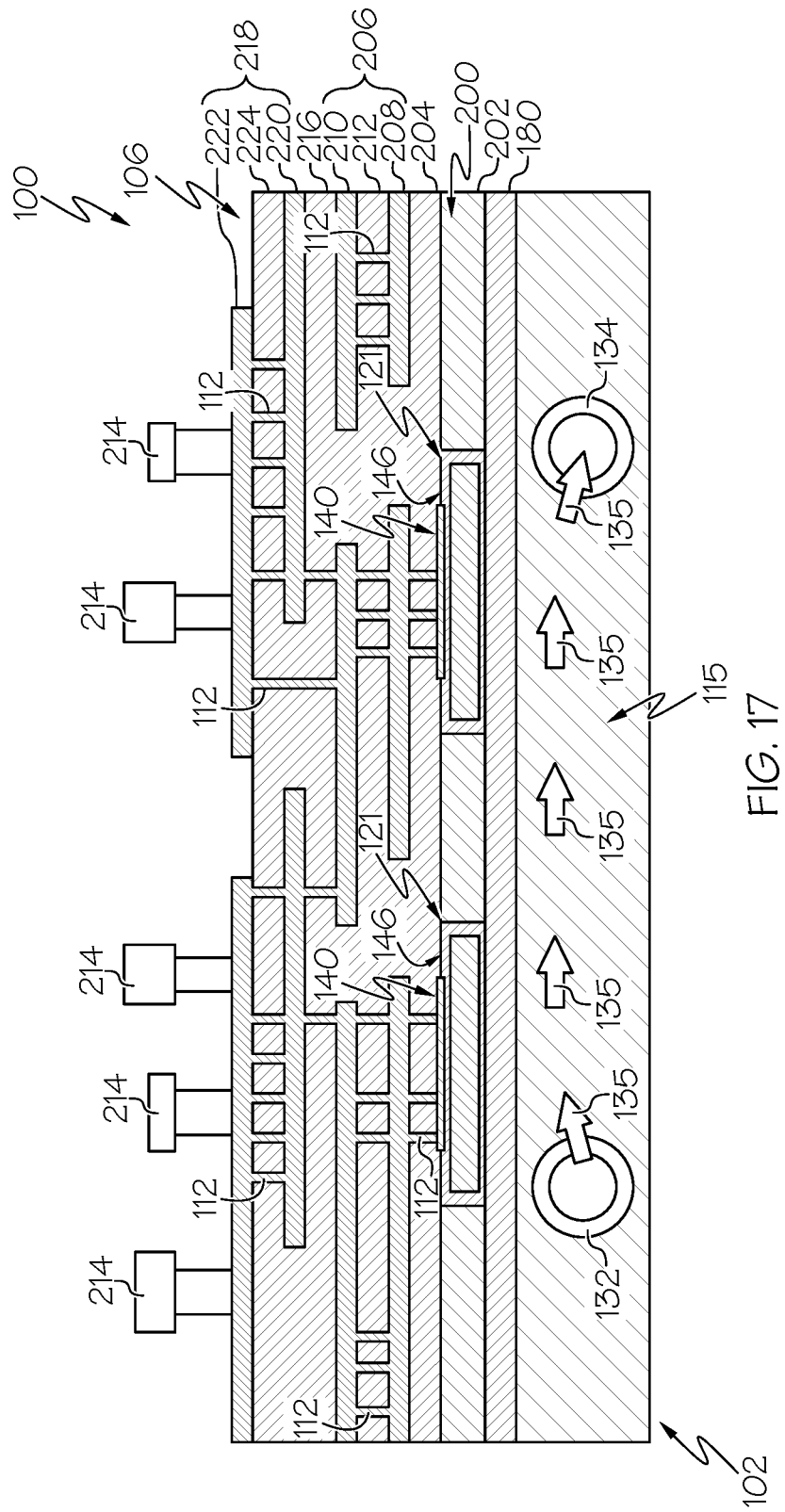
FIG. 17 schematically depicts an assembled cross-section view of the power electronics assembly of FIG. 1 including a plurality of surface mounted electronics, according to one or more embodiments described and illustrated herein.

Referring now to FIG. 17, one or more surface mounted electronics 214 may be mounted to the fourth electrically conductive layer 222. As described herein, the surface mounted electronics 214 may include, for example, transistors, resistors, capacitors, and the like. Accordingly, it should be appreciated that the circuit board assembly 106 includes at least the laminate panel 200, including the plurality of power electronics device assemblies 146, the first two layer circuit pair 206, the second two layer circuit pair 218, and the surface mounted electronics 214.

From the above, it is to be appreciated that defined herein are power electronics assemblies and methods for fabricating the same. Specifically, the power electronics assemblies disclosed herein include a circuit board assembly including a first electrically insulating layer, an electrically insulating substrate, a laminate panel provided between the first electrically insulating layer and the electrically insulating substrate, and one or more electrically conductive layers provided within the electrically insulating substrate. The laminate panel includes a power electronics device assembly including an S-cell and a power electronics device. The S-cell includes a graphite layer and a metal layer encasing the graphite layer. A recess is formed in an outer surface of the metal layer and the power electronics device is disposed within the recess of the outer surface of the S-cell.

It should now be understood that embodiments of the present disclosure are directed to power electronics assemblies having a circuit board assembly coupled to a power electronics device assembly that includes a cold plate containing an S-cell. A power electronics device may be embedded within the S-cell and/or within the circuit board assembly. Such power electronics assemblies are compact, provide increased thermal conductivity while maintaining the ability to electrically insulate S-cells, thereby improving heat flux from the S-cell to the cold plate, thereby increasing heat spreading and cooling performance of the circuit board assembly relative to conventional packages.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

What is claimed is:

1. A power electronics assembly comprising:
a circuit board assembly comprising:
a first electrically insulating layer;
an electrically insulating substrate;
a laminate panel provided between the first electrically insulating layer and the electrically insulating substrate, the laminate panel comprising:
a power electronics device assembly comprising:
an S-cell comprising:
a graphite layer; and
a metal layer encasing the graphite layer, a recess formed in an outer surface of the metal layer; and
a power electronics device disposed within the recess of the outer surface of the S-cell; and
one or more electrically conductive layers provided within the electrically insulating substrate.

2. The power electronics assembly of claim 1, wherein the laminate panel comprises:
a laminate material; and
a plurality of power electronics device assemblies embedded within the laminate material.

3. The power electronics assembly of claim 2, wherein the laminate material comprises FR-4.

4. The power electronics assembly of claim 1, wherein the first electrically insulating layer and the electrically insulating substrate each comprise an insulation metal substrate dielectric film.

5. The power electronics assembly of claim 1, wherein the circuit board assembly further comprises a plurality of vias extending through the electrically insulating substrate and thermally coupling the power electronics device to the one or more electrically conductive layers.

6. The power electronics assembly of claim 1, wherein the S-cell has a length that is greater than a width of the S-cell.

7. The power electronics assembly of claim 1, further comprising a cold plate, wherein the circuit board assembly is bonded to a surface of the cold plate by the first electrically insulating layer.

8. A power electronics assembly comprising:
a circuit board assembly comprising:
a first electrically insulating layer;
an electrically insulating substrate;

a laminate panel provided between the first electrically insulating layer and the electrically insulating substrate, the laminate panel comprising:
  a plurality of power electronics device assemblies, each power electronics device assembly comprising:
    an S-cell comprising:
      a graphite layer; and
      a metal layer encasing the graphite layer, a recess formed in an outer surface of the metal layer; and
    a power electronics device disposed within the recess of the outer surface of the S-cell; and
  one or more electrically conductive layers provided within the electrically insulating substrate
  a plurality of thermal vias thermally coupling each of the power electronics devices to the one or more electrically conductive layers; and
  a cold plate, the metal layer of each S-cell bonded to the circuit board assembly is bonded to a first surface of the cold plate via the first electrically insulating layer.

9. The power electronics assembly of claim 8, wherein: the laminate panel comprises a laminate material; and the plurality of power electronics device assemblies are embedded within the laminate material.

10. The power electronics assembly of claim 9, wherein the laminate material comprises FR-4.

11. The power electronics assembly of claim 8, wherein the first electrically insulating layer and the electrically insulating substrate each comprise an insulation metal substrate dielectric film.

12. The power electronics assembly of claim 5, wherein the S-cell has a length that is greater than a width of the S-cell.

13. A method comprising:
  providing a first electrically insulating layer on a first surface of a cold plate;
  providing a laminate panel on the first electrically insulating layer opposite the cold plate, the laminate panel comprising:
    a power electronics device assembly comprising:
      an S-cell comprising:
        a graphite layer; and
        a metal layer encasing the graphite layer, a recess formed in an outer surface of the metal layer; and
      a power electronics device disposed within the recess of the outer surface of the S-cell;
  laminating a first two layer circuit pair onto the laminate panel opposite the first electrically insulating layer;
  laser drilling vias through the first two layer circuit pair; and
  filling the vias with an electrically conductive material to thermally couple the first two layer circuit pair to the power electronics device.

14. The method of claim 13, further comprising laminating a second two layer circuit pair onto the first two layer circuit pair opposite the laminate panel.

15. The method of claim 14, further comprising laser drilling vias through the second two layer circuit pair.

16. The method of claim 15, further comprising filling the vias extending through the second two layer circuit pair with the electrically conductive material to thermally couple the second two layer circuit pair to the first two layer circuit pair.

17. The method of claim 16, further comprising mounting a surface mounted electronic onto the second two layer circuit pair.

18. The method of claim 14, wherein the first two layer circuit pair and the second two layer circuit pair each include a pair of electrically conductive layers and an electrically insulating layer positioned therebetween.

19. The method of claim 18, wherein the pair of electrically conductive layers of the first two layer circuit pair and the pair of electrically conductive layers of the second two layer circuit pair are etched.

20. The method of claim 13, wherein the laminate panel comprises:
  a laminate material; and
  a plurality of power electronics device assemblies embedded within the laminate material.

* * * * *